(12) United States Patent
Kern et al.

(10) Patent No.: US 7,049,625 B2
(45) Date of Patent: May 23, 2006

(54) FIELD EFFECT TRANSISTOR MEMORY CELL, MEMORY DEVICE AND METHOD FOR MANUFACTURING A FIELD EFFECT TRANSISTOR MEMORY CELL

(75) Inventors: Klaus Kern, Waldenbuch (DE); Marko Burghard, Leonberg (DE); Jingbiao Cui, Stuttgart (DE)

(73) Assignee: Max-Planck-Gesellschaft zur Fonderung der Wissenschaften E.V., Munich (DE)

( * ) Notice: Subject to any disclaimer, the term of this patent is extended or adjusted under 35 U.S.C. 154(b) by 0 days.

(21) Appl. No.: 10/391,066

(22) Filed: Mar. 17, 2003

(65) Prior Publication Data

US 2004/0031975 A1 Feb. 19, 2004

(30) Foreign Application Priority Data

Mar. 18, 2002 (DE) ............... 102 11 897
May 24, 2002 (DE) ............... 102 23 159

(51) Int. Cl.
*H01L 29/06* (2006.01)

(52) U.S. Cl. .............. 257/9; 257/24; 257/288; 257/347; 257/390; 977/DIG. 1

(58) Field of Classification Search .......... 257/9, 257/14, 24, 288, 347, 390; 977/DIG. 1
See application file for complete search history.

(56) References Cited

U.S. PATENT DOCUMENTS 5,962,863 A * 10/1999 Russell et al. ............ 257/14

| 6,069,380 | A | 5/2000 | Chou et al. ............ 257/315 |
| 6,248,674 | B1 | 6/2001 | Kamins et al. ............ 438/798 |
| 6,300,193 | B1 | 10/2001 | Forbes ............ 438/257 |
| 6,430,511 | B1 | 8/2002 | Tour et al. ............ 702/19 |
| 6,459,095 | B1 | 10/2002 | Heath et al. ............ 257/14 |
| 6,504,292 | B1 | 1/2003 | Choi et al. ............ 313/310 |
| 6,559,468 | B1 * | 5/2003 | Kuekes et al. ............ 257/14 |
| 6,566,704 | B1 * | 5/2003 | Choi et al. ............ 257/314 |
| 6,740,910 | B1 * | 5/2004 | Roesner et al. ............ 257/213 |
| 6,781,166 | B1 | 8/2004 | Lieber et al. ............ 257/211 |
| 6,798,000 | B1 | 9/2004 | Luyken et al. ............ 257/213 |
| 2001/0054709 | A1 | 12/2001 | Heath et al. ............ 257/25 |

FOREIGN PATENT DOCUMENTS

EP          1 069 588 A2     1/2001
WO       WO 00/44094 A1     7/2000

(Continued)

OTHER PUBLICATIONS

S. Tiwari et al., "A silicon nanocrystals based memory", *Applied Phys. Letters*, vol. 68, No. 10, pp. 1377-1379, Mar. 1996.

(Continued)

*Primary Examiner*—Gene M. Munson
(74) *Attorney, Agent, or Firm*—Sierra Patent Group, Ltd.

(57) ABSTRACT

A field effect transistor memory cell has a source region, a drain region, a channel region and a gate region, with the channel region extending from the source region to the drain region and being formed from at least one nanowire which has at least one defect such that charges can be trapped in the defects and released from the defects by a voltage applied to the gate region. A memory device built up from such memory cells and a method of manufacturing such memory cells is also disclosed.

18 Claims, 5 Drawing Sheets

FOREIGN PATENT DOCUMENTS

WO     WO 02/03482 A1     1/2002
WO     WO 01/03208 A1     1/2001

OTHER PUBLICATIONS

T. Rueckes et al., "Carbon Nanotube-Based Nonvolatile Random access Memory for Molecular Computing", *Science*, vol. 289, pp. 94-97, Jul. 2000.

P. Normand et al., "MOS memory devices based on silicon nanocrystal arrays fabricated by very low energy ion implantation", *Materials Science and Engineering C.* vol. 15, pp. 145-147, 2001 (no month).

A. Bachtold et al., "Logic Circuits with Carbon Nanotube Transistors", *Science*, vol. 294, pp. 1317-1320, Nov. 9, 2001.

* cited by examiner (A)

(B)

(C)

(D)

(A)

(B)

FIELD EFFECT TRANSISTOR MEMORY CELL, MEMORY DEVICE AND METHOD FOR MANUFACTURING A FIELD EFFECT TRANSISTOR MEMORY CELL

PRIORITY CLAIM

This application claims priority to German Application Serial Number 10211879.3, filed Mar. 18, 2002, and German Application Serial Number 10223159.1 filed May 24, 2002.

BACKGROUND

The invention relates to a field effect transistor memory cell having a source region, a drain region, a channel region and a gate region, with the channel region extending from the source region to the drain region and being formed by at least one nanowire. Furthermore, the invention relates to a semiconductor memory device which comprises a plurality of such field effect transistor memory cells and to a method of manufacturing such a memory cell or a plurality of memory cells which can be connected together to form a semiconductor memory device or are connected together to form a semiconductor memory device.

A field effect transistor (FET) of which the source, channel and drain regions are formed by a nanowire and the gate region of which is formed by a nano tube is known from WO 02/03482 A1. A storage of electrical charges is not provided for in this FET.

A memory structure in which electrical charges can be stored in silicon nano-crystals with a size of approximately 5 nm is described in the article by S. Tiwari et al., Appl. Phys. Lett. 68 (10), pages 1377–1379 (1996). The memory structure is based on a silicon field effect transistor in which the entire channel region is covered by a layer of silicon nanocrystals, with this nanocrystal layer being separated by a thin tunnel oxide from the channel region and by a thicker tunnel oxide from the gate region.

A "floating gate" MOSFET is known from the article by P. Normand, Mat. Sci. Eng. C 15, pages 145–147 (2001) in which silicon nanocrystals are used as charge storage elements and are embedded in the gate oxide.

A logic circuit is described in the article by A. Bachtold, Science 294, pages 1317–1320 (2001) which is formed from a plurality of field effect transistors on the basis of single walled carbon nanotubes. The semiconducting nanotubes each form the channel region of a field effect transistor. They are each contacted by two gold electrodes and an aluminium wire which acts as a gate is arranged between them. The aluminium wire is electrically insulated relative to the nanotubes by thin layer of native aluminium oxide.

T. Rueckes et al. describe in Science 289, pages 94–97 (2000) a non-volatile memory with random access ("non-volatile random access memory") in which a plurality of nanotubes and/or nanowires are arranged transverse to one another. Two crossing nanotubes or nanowires are spaced from one another and the spacing can be changed by the application of a voltage as a result of the attractive electrostatic forces. Because of the interplay of the elastic deformation energy and the attractive van der Waals energy of the nanotubes or -wires two precisely defined states, so-called bistable states, can be set up in this manner. In one state two crossing nanotubes or nanowires are in contact with one another, in the other state they are not in contact with one another. In this arrangement the resistance of the individual nanotubes or nanowires remains largely unchanged. In order to switch over between the two states voltages of up to 40 V are necessary.

BRIEF DESCRIPTION OF THE INVENTION

The invention is based on the object of providing a memory cell or a memory device with particularly small switching times or switching voltages in which electrical charges can be stored for the longest possible time in a stable manner.

In order to satisfy this object a field effect transistor memory cell is provided having a source region, a drain region, a channel region and a gate region, with the channel region extending from the source region to the drain region and being formed by at least one nanowire which has at least one defect such that charges can be trapped in and are releasable from the defects by a voltage applied to the gate region.

The memory cell in accordance with the invention resembles in its basic structure a customary field effect transistor with the channel region consisting however of a semiconducting wire having defects, and not of a thin layer. By the application of a gate voltage charges can be reversibly stored in the defects. The trapping and release of charges represents the "writing" and "deletion" procedures of the memory cell. As a result of the small diameter of the nanowire its conductivity is in each case strongly changed during the storing or release of charges.

An important advantage of the memory cell of the invention is that the storage of charges is achieved without the use of additional so-called "floating gates" which play a key role in customary silicon memory components, for example in EEPROMs (electrical erasable program only memories).

By dispensing with "floating gates" the manufacture of which typically requires high precision adjustment means, the field effect transistor memory cell in accordance with the invention is comparatively simple and can consequently also be manufactured at favourable cost. As a result of the small diameter of the nanowires, which typically lies in the order of magnitude of a few nano-meters, a high integration of the memory cell of the invention can be achieved, i.e. a high packing density of memory cells in a memory device.

Whereas switching voltages of less than 5 volts are required for the trapping and releasing of charges in the defects, the shifts in the threshold voltage amount to more than 1 volt. Since the charges only have to be shifted over a very short distance particularly short switching times are achieved which can lie far below one millisecond. Tests have shown that charges trapped in the defects can be stored in a stable manner over a time period of at least one week.

An explanation for the storage of electrical charges lies in the fact that the or each defect forms a quantum well with at least one discrete energy level for one or more charge carriers. This is however only one possibility of explanation, particularly since the prediction of the detailed electronic structure of the defects is in any event very difficult. In principle it is also conceivable that the or each defect is a metallic region (with an electron continuum) which then charges up (for which purpose a coulomb charge energy has to be applied as a result of its very small capacity).

In accordance with an advantageous embodiment of the memory cell of the invention the defects have arisen during the formation of the at least one nanowire. In this manner nanowires adapted directly to the memory cell can be intentionally manufactured.

As an alternative the defects can be defects which have arisen after the formation of the at least one nanowire. This increases the flexibility in selecting suitable nanowires because these can for example be adapted intentionally by a suitable after-treatment to the respective memory cell.

The defects can for example be formed by a temperature treatment of the at least one nanowire in a gas atmosphere. Through the possibility of setting the temperature and gas atmosphere separately, the formation of defects in the nanowire can be controlled particularly well and can be adapted easily to different memory cells.

As an alternative the defects can be formed by bombardment of the at least one nanowire with ions and/or reactive elements and/or compounds. Such methods of bombarding components with particles are adequately known per se and can likewise be well adapted to the respective demands of different memory cells.

The defects can be both structural defects and also chemical defects. It is particularly favourable when the defects are formed by a chemical group attached to the at least one nanowire and when the chemical group includes a benzene molecule which is bonded by a C—C— or C—N—C-bond to the at least one nanowire. A defect of this kind can prove to be effective for the storage of charges.

The at least one nanowire can have one of the following forms: a massive wire form, a closed tube form, an open tube form or a strip form. Each of the above-named forms is particularly well suited for a nanowire which can be used in a memory cell in accordance with the invention, with an advantageous freedom in the design of memory cells in accordance with the invention being given by the multiplicity of the forms.

A further subject of the invention is a semiconductor storage device consisting of a plurality of field effect transistor memory cells in accordance with the invention and of the above-named kind, which are arranged in a matrix on a carrier substrate.

By connecting a plurality of memory cells in accordance with the invention together the memory device in accordance with the invention can already achieve the advantages named in conjunction with the memory cell with respect to the constructional size, the low switching voltages, the short switching times and the long time stability of the charge storage.

In accordance with an advantageous embodiment of the memory device of the invention the nanowires of the individual memory cells are arranged at least approximately parallel to one another in rows and/or in columns on the carrier substrate. This systematic arrangement in rows and/or in columns enables a particularly simple and easily comprehended interconnection of the individual memory cells.

The nanowires can be arranged in groups on a surface of the carrier substrate. The grooves represent a compulsory guidance for the nanowires so that, through a predetermined arrangement of the grooves, a desired alignment of the nanowires can be achieved in a simple manner.

The memory cells of each row or of column preferably have respective discrete drain and gate electrodes but only one common source electrode. In this manner the contacting or metallization effort required during the manufacture of the storage device of the invention can be reduced.

The subject of the invention is moreover a method of manufacturing a field effect transistor memory cell or a plurality of memory cells which are to be connected together to form a semiconductor memory device or are already connected together to form a semiconductor memory device, in particular in accordance with at least claim 11, having at least one nanowire which extends at least after manufacture between a source region and a drain region. The method is characterized in that the or each nanowire is treated so that at least one defect produced in each case which forms a quantum well having at least one discrete energy level.

Through the method of the invention the advantages named in conjunction with the memory cell of the invention and the memory device of the invention can be realized.

In accordance with an advantageous embodiment of the method of the invention a collection of nanowires, which at least partly stuck to one another and form bundles of nanowires are split up in a solution of a surface active material, in particular of a tenside, at least partly into individual nanowires and are applied with the solution onto the surface of a carrier substrate and then treated to produce the defects. Consequently, nanowires of the kind available in commerce, and in a starting form available in commerce, can be used for the manufacture of the memory cell or memory device in accordance with the invention. A raw mass, i.e. a collection of nanowires or bundles of nanowires which can be commercially purchased merely has to be split down into individual nanowires and the individual nanowires subsequently have to be subjected to a treatment in order to produce the necessary defects.

The nanowires, some of which have a metallic conductivity and some of which have a semiconductor characteristic are preferably influenced by a thermal treatment, optionally in the gas atmosphere in such a way that the nanowires of metallic conductivity are converted into semiconducting nanowires and provided with defects. This leads to an increased flexibility in the selection of suitable nanowires because nanowires need not necessarily be selected which already have the required semiconducting characteristic in the starting state. Instead the conductivity of the starting nanowires can differ within certain limits from the conductivity that is aimed at, they can indeed partly have a metallic conductivity, and the correct conductivity is set up during the same process step in which the defects are produced. I.e. the production of the correct conductivity of the nanowires in the production of the defects takes place simultaneously, so that no additional process step need to be introduced which would complicate the manufacture of the memory cell and memory device of the invention. The object is to obtain semiconducting nanowires with defects, with the well metered defects still permitting acceptable conductivity of the (semiconducting) nanowire.

A surface of a carrier substrate is advantageously pretreated in such a way that the nanowires and/or bundles of nanowires arrange themselves in an orderly manner as a result of the self organisation effect and in particular align themselves at least approximately parallel to one another. In this way an ordered structure of the nanowires can be achieved in a simple manner which facilitates the contacting or metallization of the individual memory cells and the interconnection of individual cells to form the memory device.

In accordance with a particularly advantageous embodiment of the method the nanowires are produced in a CVD process on a carrier substrate between already present source and drain regions with the simultaneous application of an electric field between the source and drain regions. In this variant of the method a collection of nanowires is not first applied onto a carrier substrate, separated into individual nanowires and subsequently metallized, but rather the source and drain regions are first defined and then the nanowires are grown directly between these regions. This signifies a simplification of the manufacturing process because in this case the metallization does not have to be matched to the position of the nanowires but rather, vice versa, the growth of the nanowires is predetermined by the metallization.

The nanowire is preferably treated following the CVD process or during the CVD process in the same apparatus with chemical elements, molecules or compounds which produce defects. This leads to a rationalization of the manufacturing process and thus to a particularly cost-favourable manufacture of the memory cell or memory device in accordance with the invention.

BRIEF DESCRIPTION OF THE DRAWINGS

In the following the invention will be described purely by way of example with reference to an advantageous embodiment and to the accompanying drawings in which are shown.

DETAILED DESCRIPTION OF THE INVENTION

Figure 1:
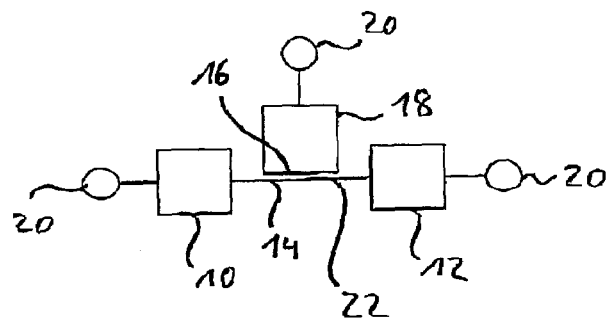
FIG. 1 is a schematic representation of a field effect transistor memory cell in accordance with the invention.

FIG. 1 shows a field effect transistor memory cell in accordance with the invention and manufactured using planar technology having a source region 10 and a drain region 12 which are connected together by a channel region 14. A gate region 18 separated by a dielectric 16, for example air or oxide, from the channel region 14 is arranged in the region of the channel region 14. Respective connections 20 are provided to the source, drain and gate regions 10, 12 and 18 in order to integrate the memory cell into a circuit, for example into a memory device.

The channel region 14 of the memory cell of the invention is, as already explained in more detail further below, formed from at least one nanowire 22 which has defects 24, 26 (see FIG. 3) in which electrical charges can be stored.

By applying a positive voltage $U_{S/D}$ to the drain region 12 a charge movement can be produced depending on the conductivity of the channel region 14 out of the source region 10 in the direction of the drain region 12. By applying a positive gate voltage charges can be trapped in the defects of the nanowire 22, whereby the conductivity of the channel region 14 is increased. Vice versa the trapped charges can be released again from the defects by the application of a negative gate voltage, so that the conductivity of the channel region 14 is reduced again.

The trapping of the charges in the defects can be achieved if required also by applying a negative gate voltage (and the release correspondingly by the application of a positive gate voltage). Decisive for the polarity of the gate voltage which is to be applied is simply whether the channel region 14 is p-conducting or n-conducting.

Through the application of gate potentials with respectively reversed signs the channel region 14 can consequently be switched between two conductive states, with the one state being a state of particularly high conductivity and the other state being of particularly low conductivity.

The switching over of the conductive states of the channel region 14 corresponds to the "writing" and "erasing" procedures of a memory cell. Through the voltage $U_{S/D}$ at the drain region 12 the respective conductive state of the channel region 14 can be interrogated, this is thus a so-called "reading" process.

Figure 2:
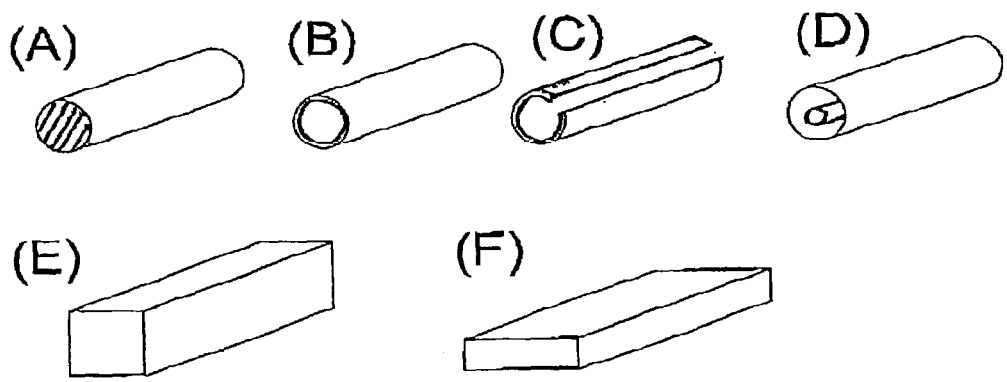
FIGS. 2A–2F are different embodiments of a nanowire of the memory cell in FIG. 1.

A nanowire 22 can have the different forms showing in FIG. 2: it can for example have a massive wire form (FIG. 2A) or be formed as a nanotube. In this connection, when forming the nanowire as a nano-tube, different embodiments can be realized. Thus, a closed tube form (FIG. 2B) or an open tube form (FIG. 2C) can be realized. On the other hand, the nanotubes can also be made with double walls or multiple walls (FIG. 2D).

As an alternative the nanowire 22 can be of strip-like form. Here strips with a square cross-section (FIG. 2E) or with a flat rectangular cross-section (FIG. 2F) are for example conceivable.

The dimensions of the nanowire 22 typically lie in the range of a few nano-meters, in at least one dimension. Thus, the diameter of a nano-tube can amount to from 1 nm to 5 nm and its length can amount to several microns. A strip-like nanowire 22 can have a height of 2 nm, a width of 200 nm and a length of 3 μm or more.

The nanowire 22 can be formed of different materials. Because of its use as the channel region 14 the nanowire 22 must however have semiconducting characteristics. Depending on the design of the nanowire 22 different materials can thus be considered. If the nanowire 22 is formed in tube form or in solid wire form then carbon, silicon or a chalcogenide are in particular suitable as materials for the nanowire 22. Suitable chalcogenides are for example tungsten oxide, tungsten selenide, tungsten sulphide, tantalum sulphide or niobium sulphide. For nanowires 22 in solid wire form silicon carbide, indium phosphide or indium arsenide can, for example, be used in addition to silicon.

For the storage of charges defects are provided in the nanowire 22. In this connection different types of defects can be considered, providing they form a quantum well with at least one discrete energy level for one or more charge carriers. Suitable are both structural defects 24, for example lattice vacancies and also chemical defects 26. Such chemical defects can, for example, be formed by one or more atoms, molecules or compounds covalently bonded to the nanowire 22 or by a chemical group attached to the nanowire 22.

In principle it is also conceivable for the defects to be a metallic region (with an electron continuum) which is then charged up (for which purpose a coulomb charge energy has to be applied as a result of its very small capacity).

Figure 3:
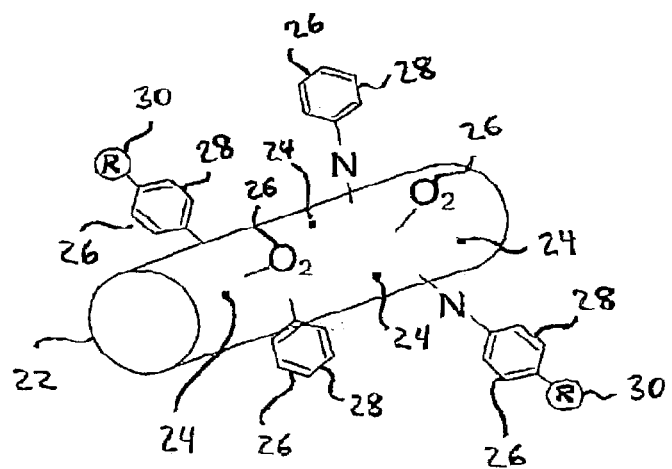
FIG. 3 is a schematic representation of a nanotube in accordance with the invention and having a plurality of defects.

In FIG. 3 a single-walled carbon nano-tube SWNT is shown with lattice vacancies in the carbon lattice as structural defects 24 and various chemical defects 26. One such chemical defect 26 can for example be formed by an oxygen molecule covalently bonded to the carbon atom. Defects 26 which consist of clusters of a plurality, for example 10 to 20 such CO bonds are also conceivable. As an alternative, or as an addition, a chemical rest or group attached to the nanowire can include a benzene molecule 28 which is bound by a C—C— or C—N—C-bond to the nanowire 22. A substituent 30 can also be attached to the benzene molecule 28 which can either act as a donor or an acceptor or as a neutral compound.

The defects 24, 26 can be formed in different manners. On the one hand there are defects which already exist during formation of the nanowire 22. If the nanowire 22 is for example manufactured in a suitable gas atmosphere, for example an atmosphere containing oxygen, nitrogen and/or fluorine and/or in a suitable temperature range then defects can be artificially induced into the nanowire 22.

On the other hand there are also defects 24, 26 which first arise after the formation of the nanowire 22. Tests have shown that suitable defects 24, 26 can form simply as a result of an aging process of the nanowire if the nanowire 22 is, for example, exposed for one year to the environmental air. It is assumed that the defects 24, 26 are, in this case, to be attributed to a slow oxidation of the nanowire 22. In this connection intrinsic defects of the nanowire 22 in the starting state can act as the starting points for an oxidation of the surface of the nanowire 22. By exposing the nanowire 22 to a suitable gas atmosphere at a suitable temperature, in particular to an oxygen containing gas atmosphere, the natural aging process can be considerably accelerated artificially so that it takes place for example in a range of minutes or hours.

A further possibility for the intentional production of defects 24, 26 in a nanowire 22 consists in bombarding the nanowire 22 with ions and/or reactive elements or compounds. Depending on the type of particles used, and also on their kinetic energy, defects can be produced as required which are of predominantly structural or predominantly chemical nature. Suitable particle bombardment processes are adequately well known in specialist circles so that these will not be discussed in further detail here.

Electrochemical processes are also suitable for the production of defects in nanowires 22, with chemical defects 26 in particular being able to be readily formed in this way. Defects 26, which can be manufactured electrochemically, include for example the benzene molecule 28 attached to the nanowire 22 as shown in FIG. 3.

Figure 4:
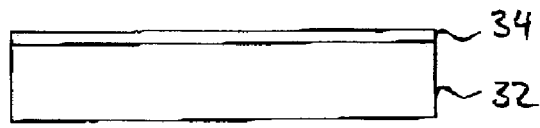
FIGS. 4A–4D are schematic representations of a plurality of process steps in the manufacture of the memory cell of the invention of FIG. 1, with FIGS. 4A and 4B each showing cross-sections and FIGS. 4C and 4D each showing plan views.
Figure 4:
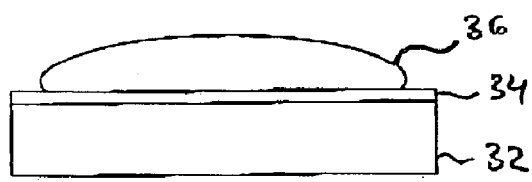
Figure 4:
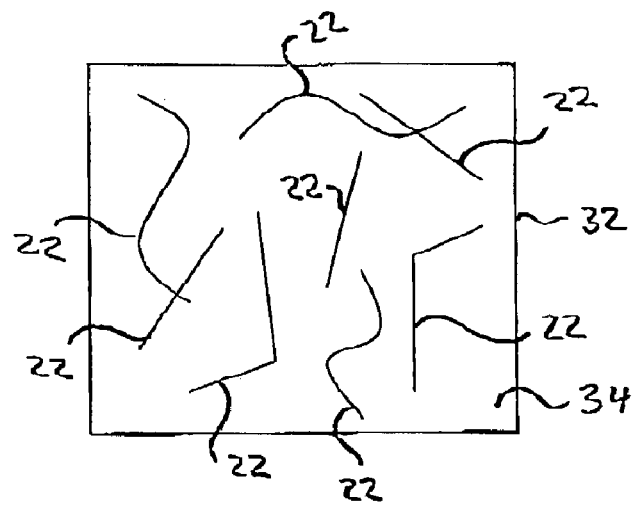
Figure 4:
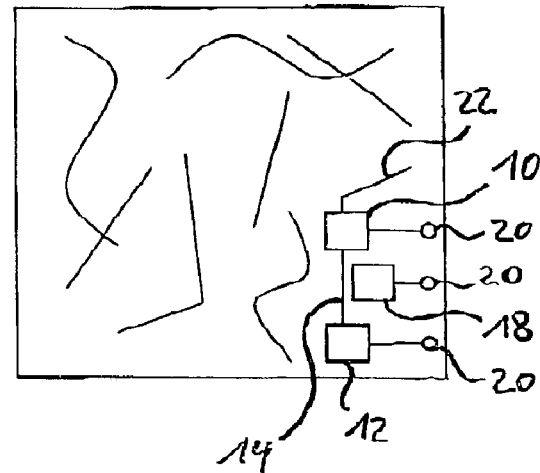

With respect to FIG. 4 the manufacture of a memory cell in accordance with the invention will now be described. First of all a suitable carrier substrate 32, in this case an $n^+$-doped silicon substrate, is provided with a thin insulating layer 34, for example a silicon dioxide layer with a thickness of approximately 100 nm (FIG. 4A). A raw mass 36 in which individual nanowires 22 or bundles of nanowires 22 are contained in contaminants or bound in a filler material (FIG. 4B) is applied onto the insulating layer 34.

By using a suitable surface active solvent, for example a tenside, or by vaporization at a suitable temperature the filling material or the contaminants of the raw mass 36 is or are subsequently removed from the carrier substrate 32, so that a mono-layer of nanowires 22 or bundles of nanowires 22 forms on the insulating layer 34 of the carrier substrate 32 (FIG. 4C). In this connection the nanowires 22 or the bundles of nanowires 22 are randomly orientated. Only the density of the nanowires 22 or of the bundles of nanowires 22, i.e. their number per unit area, can be controlled in this process. The contaminants or the filler material can also be removed prior to the application onto the carrier substrate 32, for example by chromatography or centrifuging.

After the application of the nanowires 22 or of the bundles of nanowires 22 onto the insulating layer 34 of the carrier substrate 32 they are subjected to a treatment which induces defects. As has already been discussed above this treatment can consist of exposing the nanowires 22 or the bundles of nanowires 22 to the environmental air and allowing them to age naturally, or causing them to age artificially at elevated temperature and in, for example, an oxygen containing gas atmosphere or by particle bombardment or by introducing defects by an electrochemical route. When the defect formation is concluded source, drain and gate regions are defined at at least one nanowire 22 or bundle of nanowires 22 and are contacted by connections 20 (FIG. 4D). It is also possible to first contact the nanowires and then to first introduce the defects later.

Figure 5:
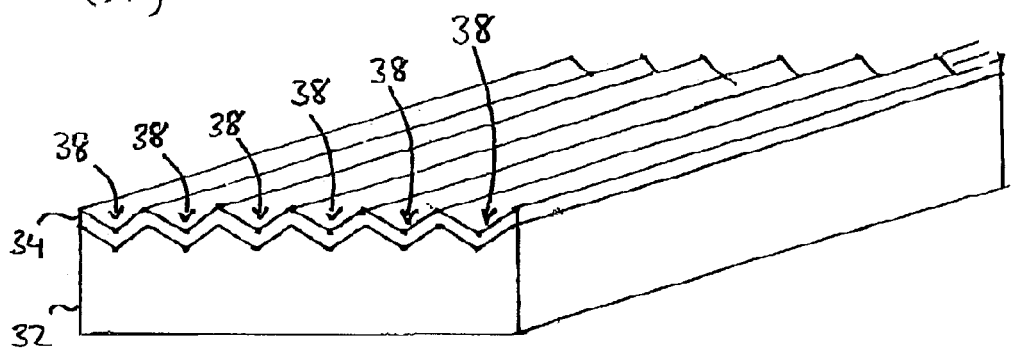
FIGS. 5A and 5B are selected process steps of an alternative method for the manufacture of the memory cell of FIG. 1.
Figure 5:
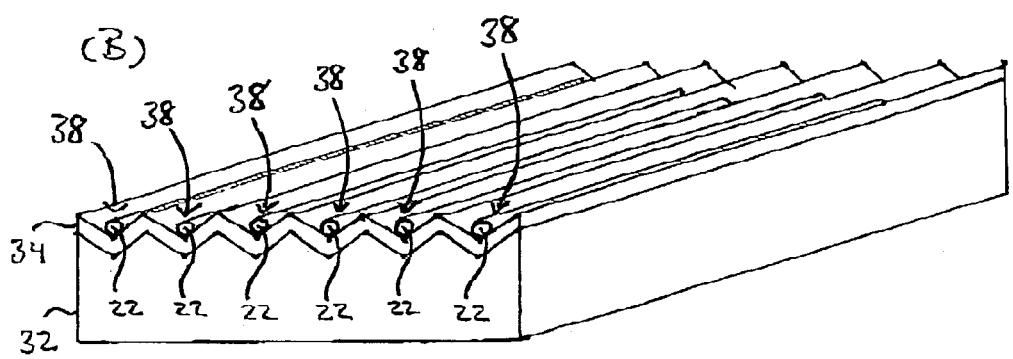

In order to prevent the random orientation of the nanowires 22 or of the bundle of nanowires 22, and instead of this to achieve a regular arrangement, in particular a parallel arrangement of the nanowires 22 or of the bundles of nanowires 22, the surface of the carrier substrate 32 provided with the insulating layer 34 can be provided with grooves 38 arranged alongside one another and extending parallel to one another, as is shown in FIG. 5. In this connection the grooves 38 can have an at least approximately half-round cross-section. Such grooves can, for example, easily be produced in silicon substrates by wire sawing. As can be seen in FIG. 5 the grooves 38 can also have a wedge-shaped cross-section.

Such wedge-shaped grooves 38 can for example be produced in mono-crystalline silicon substrate with a suitable orientation by preferential etching in solutions containing KOH. Another possibility of generating such a groove-like structure lies in manufacturing this structure by self organization of a mono-crystalline substrate such as is for example described in U.S. Pat. No. 5,714,765.

As is shown in FIG. 5B the nanowires 22 or the bundles of nanowires 22 locate themselves in the grooves 38 on the removal of the filler material of the raw mass 36. Since the nanowires 22 or the bundles of nanowires 22, and thus the channel regions 14, are now located at predetermined positions, the completion of the memory cell is considerably simplified. Moreover, through the regular arrangement of the nanowires 22 or the bundles of nanowires 22, an interconnection of a plurality of individual memory cells into a memory device in accordance with the invention is made possible.

Figure 6:
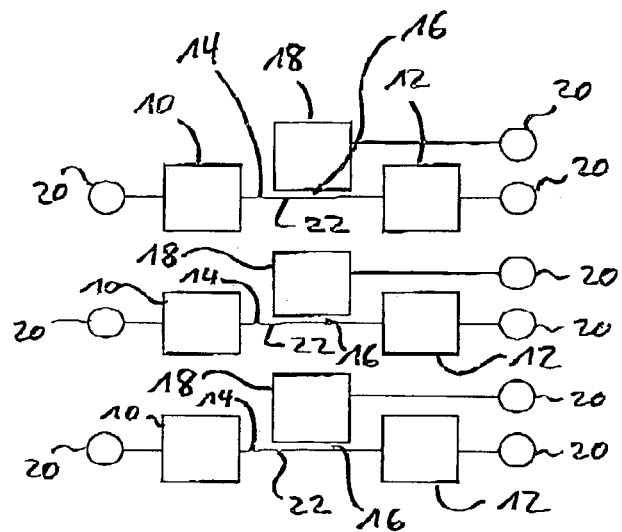
FIG. 6 is a schematic representation of a plurality of memory cells in accordance with FIG. 1 arranged together which are connectable into a memory device in accordance with the invention.

FIG. 6 shows by way of example an arrangement of three memory cells in accordance with the invention. The memory cells are so arranged relative to one another, that the respective source, drain and gate regions 10, 12 and 18 each form a row. The connections 20 of the source and drain regions 10, 12 each point in opposite directions away from the memory cells. The connection 20 of the gate region 18 of each memory cell is led past the respective drain region 12 and points in the same region as the connection of the respective drain region 12.

The spacing between two adjacent memory cells is, on the one hand, so selected that the connection 20 of one gate region 18 can be led out between two drain regions 12 and, on the other hand, such that the gate region 18 of one memory cell merely controls the channel region 14 of this memory cell without simultaneously influencing the channel regions 14 of the neighbouring memory cells.

Figure 7:
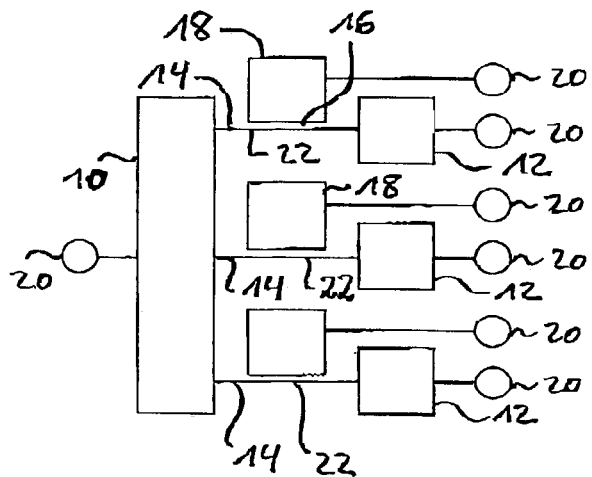
FIG. 7 is a schematic representation of a plurality of memory cells which are arranged beneath one another with a common source region.

Whereas, in the memory cell arrangement of FIG. 6, each memory cell is provided with its own source region 10 and a corresponding connection 20, the memory cells of the arrangement shown in FIG. 7 have a source region 10 which is common to all of them. As in the memory cell arrangement of FIG. 6, each individual memory cell can also be separately controlled in the arrangement of FIG. 7, via the respective connections 20 of their respective drain and gate regions 12 and 18.

Figure 8:
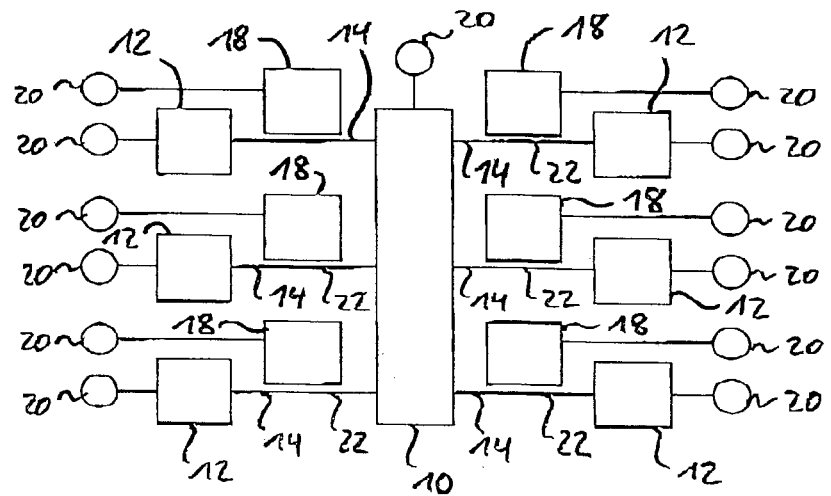
FIG. 8 is a schematic representation of a plurality of memory cells arranged in two columns and in three rows with a common source region.

FIG. 8 shows an exemplary arrangement of six memory cells in accordance with the invention, with the memory cells being arranged in three rows and two columns. All six memory cells share a common elongate shaped source region 10 which is orientated parallel to the two columns and disposed between them and thereby crosses the three rows. The memory cells of the two columns are consequently orientated as a mirror image to each other, with the source region 10 extending along the mirror axis. The drain regions 12 of the memory cells of one row and also the associated connections 20 consequently lie on opposite sides of the source region 10 and point away from it. Correspondingly the connections 20 of the gate regions 18 of memory cells disposed on different sides of the source region 10 point in opposite directions.

In accordance with the arrangements shown in FIGS. 6 to 8, and also other arrangements not shown, a plurality of memory cells in accordance with the invention can be connected together to form a memory device in accordance with the invention.

Figure 9:
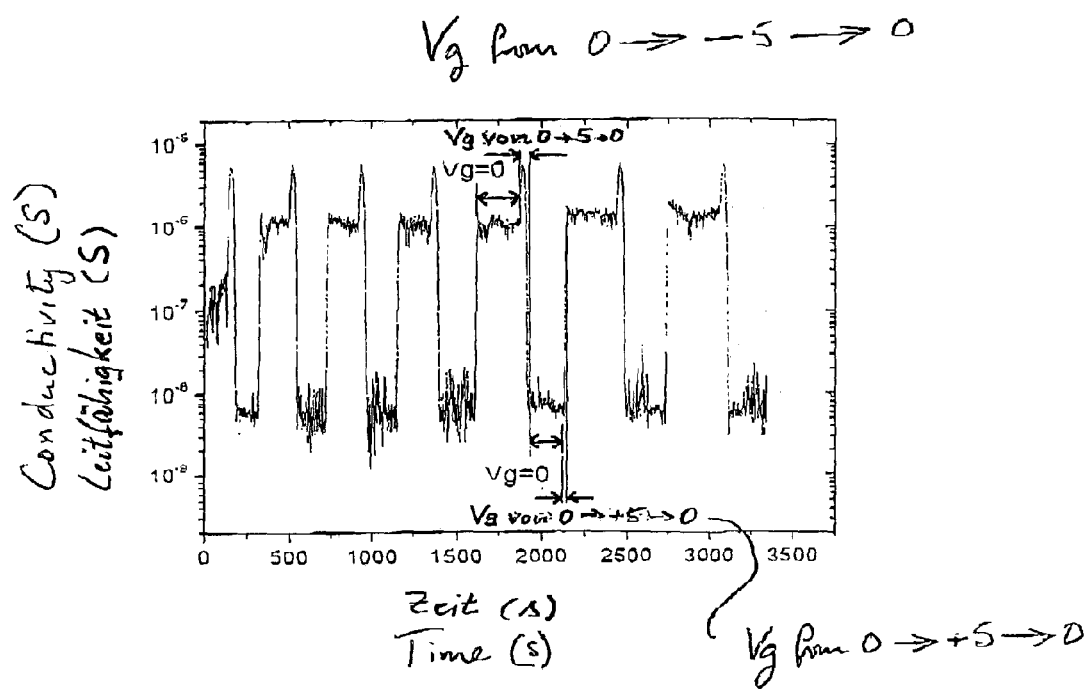
FIG. 9 is a graph in which the conductivity of a bundle of single-walled carbon nanotubes of a memory cell in accordance with the invention is shown as a function of time.

FIG. 9 shows a graph in which the conductivity of a memory cell in accordance with the invention is shown as a function of time. The memory cell was manufactured in accordance with the method described in conjunction with FIG. 4, with the channel region 14 being formed by a bundle of single-walled carbon nanotubes with a diameter of approximately 3 nm. The bundle of nanotubes was exposed to the environmental air for one year, with a slow oxidation of the nanotubes taking place. This oxidation led to the formation of defects in the nanotubes which act as charge storage units in the memory cell.

The graph shows two stable conductive states of the nano-tube bundle at room temperature and in each case at a gate potential of 0 V. The conductivity of the two stable conductive states is distinguished by two orders of magnitude. The switching over between the two states takes place by a short term application of a gate potential of +5 V or −5 V.

What is claimed is:

1. Field effect transistor memory cell having a source region, a drain region, a channel region and a gate region, with the channel region extending from the source region to the drain region and being formed by at least one nanowire which has at least one defect such that charges can be trapped in and released from the defects by a voltage applied to the gate region.

2. Memory cell in accordance with claim 1, characterized in that the defects forms a quantum well with at least one discrete energy level for one or more charge carriers.

3. Memory cell in accordance with claim 1, characterized in that the or each defect is a defect which has arisen during the formation of the at least one nanowire.

4. Memory cell in accordance with claim 1, characterized in that the or each defect is a defect which has arisen after the formation of at least one nanowire.

5. Memory cell in accordance with claim 1, characterized in that the or each defect is a defect induced from the outside.

6. Memory cell in accordance with claim 1, characterized in that the or each defect is a structural defect.

7. Memory cell in accordance with claim 1, characterized in that the or each defects is formed by bombardment of the at least one nanowire with ions and/or reactive elements and/or compounds.

8. Memory cell in accordance with claim 1, characterized in that the at least one nanowire has one of the following forms: a solid wire form, a closed tube form, an open tube form or a strip form.

9. Memory cell in accordance with claim 1, characterized in that the at least one nanowire is formed of one of the following materials: in tube form or in solid wire form of carbon, silicon or a chalcogenide, including tungsten oxide, tungsten selenide, tungsten sulphide, tantalum sulphide, niobium sulphide and in massive wire form of silicon, silicon carbide, indium phosphide or indium arsenide.

10. Semiconductor memory device comprising:
a carrier substrate;
a plurality of field effect transistor memory cells arranged in a matrix on said carrier substrate; and
wherein each of said plurality of field effect transistor memory cells has a source region, a drain region, a channel region and a gate region, with the channel region extending from the source region to the drain region and being formed by at least one nanowire which has at least one defect such that charges can be trapped in and released from the defects by a voltage applied to the gate region.

11. Memory device in accordance with claim 10, characterized in that the at least one nanowire of each one of said plurality of field effect transistor memory cells are arranged at least approximately parallel to one another in rows and/or in columns on the carrier substrate.

12. Memory device in accordance with claim 11, characterized in that each of the plurality of field effect transistor memory cells of a row in said matrix have a discrete drain electrode, a discrete gate electrode and a source electrode in common with each other ones of said plurality of field effect transistor memory cells in said row.

13. Memory device in accordance with claim 11, characterized in that each of the plurality of field effect transistor memory cells of a column in said matrix have a discrete drain electrode, a discrete gate electrode, and a source electrode in common with each other ones of said plurality of field effect transistor memory cells in said column.

14. Memory device in accordance with claim 10, characterized in that the nanowires of the plurality of field effect transistor memory cells are arranged in grooves on a surface of a single crystal carrier substrate.

15. Memory device in accordance with claim 14, characterized in that the grooves are formed by self organisation of the surface of the single crystal carrier substrate.

16. Memory device in accordance with claim 10, characterized in that each of said plurality of field effect transistor memory cells further comprises: a discrete source electrode, a discrete drain electrode and a discrete gate electrode.

17. Memory device in accordance with claim 16, characterized in that the gate electrode of each of said plurality of field effect transistor memory cells is provided on side surfaces of the grooves, accommodating the at least one nanowire.

18. Memory device in accordance with claim 10, characterized in that the plurality of field effect transistor memory cells are separated from the atmosphere by a protective layer.

* * * * *